US011320704B2

(12) United States Patent
Lee et al.

(10) Patent No.: US 11,320,704 B2
(45) Date of Patent: May 3, 2022

(54) DISPLAY DEVICE

(71) Applicant: Samsung Display Co., Ltd., Yongin-Si (KR)

(72) Inventors: Yoo Jeong Lee, Seoul (KR); Seung Jae Kang, Asan-si (KR); Po-Yun Park, Seoul (KR); Hak Bum Choi, Cheonan-si (KR)

(73) Assignee: Samsung Display Co., Ltd.

( * ) Notice: Subject to any disclaimer, the term of this patent is extended or adjusted under 35 U.S.C. 154(b) by 339 days.

(21) Appl. No.: 16/781,982

(22) Filed: Feb. 4, 2020

(65) Prior Publication Data

US 2021/0018777 A1    Jan. 21, 2021

(30) Foreign Application Priority Data

Jul. 19, 2019   (KR) .................. 10-2019-0087534

(51) Int. Cl.
*H05K 1/18*     (2006.01)
*H05K 5/00*     (2006.01)
(Continued)

(52) U.S. Cl.
CPC ........... *G02F 1/1343* (2013.01); *H05K 1/189* (2013.01); *H05K 5/0017* (2013.01); *G02F 1/13629* (2021.01); *G02F 1/136245* (2021.01)

(58) Field of Classification Search
CPC .. H05K 5/0017; H05K 5/0021; H05K 5/0026; H05K 5/0034; H05K 1/189; G02F 1/1343; G02F 1/13629
See application file for complete search history.

(56) References Cited

U.S. PATENT DOCUMENTS

2009/0213534 A1* 8/2009 Sakai .................. G02F 1/13452
                                                  361/679.21
2012/0200545 A1* 8/2012 Takahashi .............. H05K 1/118
                                                  174/254

(Continued)

FOREIGN PATENT DOCUMENTS

KR     10-1405074 B1    6/2014
KR     10-1853032 B1    6/2018
(Continued)

*Primary Examiner* — Hoa C Nguyen
(74) *Attorney, Agent, or Firm* — Innovation Counsel LLP

(57) ABSTRACT

A display device includes: a first substrate that includes a plurality of first pads arranged in a first direction and a plurality of second pads arranged in parallel with the plurality of first pads; a second substrate that overlaps the first substrate and includes a second substrate including one edge exposing the plurality of first pads and the plurality of second pads; a first flexible printed circuit board that is electrically connected with the plurality of first pads; a second flexible printed circuit board that overlaps the first flexible printed circuit board and is electrically connected with the plurality of second pads; a protective layer that covers the first flexible printed circuit board and the second flexible printed circuit board from one edge of the second substrate to a width including the plurality of first pads and the plurality of second pads; and a blocking portion disposed on the first substrate at a distance from one edge of the second substrate by a width of the protective layer and contacting the protective layer.

20 Claims, 9 Drawing Sheets

(51) Int. Cl.
    *G02F 1/1343*     (2006.01)
    *G02F 1/1362*     (2006.01)

(56) References Cited

U.S. PATENT DOCUMENTS

| | | | |
|---|---|---|---|
| 2015/0223359 A1* | 8/2015 | Kang | H05K 1/14 361/752 |
| 2016/0128174 A1* | 5/2016 | Lim | G02F 1/13458 174/254 |
| 2016/0205764 A1* | 7/2016 | Namkung | G02F 1/133502 361/749 |
| 2016/0299386 A1* | 10/2016 | Ueno | G02F 1/13452 |
| 2018/0053817 A1* | 2/2018 | Kishimoto | H01L 51/5253 |
| 2019/0280075 A1* | 9/2019 | Chung | H05K 1/189 |
| 2019/0380209 A1* | 12/2019 | Jeon | H05K 1/0281 |
| 2021/0333632 A1* | 10/2021 | Wu | H05K 1/00 |

FOREIGN PATENT DOCUMENTS

| | | |
|---|---|---|
| KR | 10-2019-0024326 A | 3/2019 |
| KR | 10-2019-0030951 A | 3/2019 |

\* cited by examiner

DISPLAY DEVICE

CROSS-REFERENCE TO RELATED APPLICATION

This application claims priority to and the benefit of Korean Patent Application No. 10-2019-0087534 filed in the Korean Intellectual Property Office on Jul. 19, 2019, the entire contents of which are incorporated herein by reference.

BACKGROUND

(a) Field

Embodiments of the present inventive concept relates to a display device. More particularly, the present inventive concept relates to a display device including a flexible printed circuit board.

(b) Description of the Related Art

Display devices generally include a display panel where an image is displayed, and a gate driver and a data driver that drive the display panel. The data driver is provided as a separated integrated circuit (IC) chip and is mounted on a flexible printed circuit board, which is bonded to the display panel so that the display panel and the data driver can be electrically connected with each other. The gate driver is mounted on the flexible printed circuit board and is electrically connected with the display panel, or may be directly integrated with the display panel.

The display panel may include a pad area where a plurality of pads provided for receiving signals from the outside are arranged, and electronic parts such as the flexible printed circuit board may be bonded to the pad area. The flexible printed circuit board may be electrically connected with the plurality of pads through an anisotropically conductive film.

Moisture, such as detergent, may flow between the flexible printed circuit board and the display panel during a manufacturing process of the display device, or ambient moisture may flow between the flexible printed circuit board and the display panel during use of the display device. In such a case, the pads or wires of the flexible printed circuit board suffer from shorting or burning.

The above information disclosed in this Background section is only for enhancement of understanding of the background of the invention and therefore it may contain information that does not form the prior art that is already known in this country to a person of ordinary skill in the art.

SUMMARY

In order to prevent defects such as shorts or burns in a plurality of pads and wires of a flexible printed circuit board, an insulation material such as silicon is coated on a portion where the flexible printed circuit board and a display panel are bonded to each other to thereby prevent water from entering between the flexible printed circuit board and the display panel.

As the resolution of the display device increases, more pads must be disposed in a limited space, so two or more flexible printed circuit boards are overlapped and bonded to the display panel. After bonding two or more flexible printed circuit boards to the display panel, an insulation material is coated. In order to form a wider insulation material to thereby cover both the portions where two or more flexible printed circuit boards and the display panel are bonded together, after the insulation material is applied, the insulation material flows down to a desired level and is then cured by using ultraviolet (UV) rays.

However, it is difficult to control the width to which the insulation material is applied because of the size of the dispersion of the insulation material that flows down. When the width of the insulation material is spread over a certain amount, the insulation material may flow out of the display panel.

The present inventive concept has been made in an effort to provide a display device that can control a coating width of an insulation material that covers a portion where a flexible printed circuit board and a display panel are bonded to each other.

A display device according to an exemplary embodiment of the present inventive concept includes: a first substrate that includes a plurality of first pads arranged in a first direction and a plurality of second pads arranged in parallel with the plurality of first pads; a second substrate that overlaps the first substrate and includes one edge exposing the plurality of first pads and the plurality of second pads; a first flexible printed circuit board that is electrically connected with the plurality of first pads; a second flexible printed circuit board that overlaps the first flexible printed circuit board and is electrically connected with the plurality of second pads; a protective layer that covers the first flexible printed circuit board and the second flexible printed circuit board from the one edge of the second substrate to a width including the plurality of first pads and the plurality of second pads; and a blocking portion disposed on the first substrate at a distance from one edge of the second substrate by a width of the protective layer and contacting the protective layer.

The blocking portion may include a first dam that extends in the first direction, protrudes from one side of the first substrate, and contacts a side surface of the protective layer.

The first dam may be formed of a plurality of layers, and the plurality of layers may include a same material as a material stacked between the first substrate and the second substrate.

A display area between the first substrate and the second substrate may include: a transistor including a gate electrode, a semiconductor layer, and a data conductor; and a color filter, an insulation layer, and a column spacer that are sequentially disposed on the transistor, and the first dam may include a same material as at least one of the gate electrode, the semiconductor layer, the data conductor, the color filter, the insulation layer, and the column spacer.

The blocking portion may further include a second dam that extends in parallel with the first dam and protrudes from one side of the first substrate.

The blocking portion may include a groove that extends in the first direction and is formed in one side of the first substrate.

Each of the first flexible printed circuit board and the second flexible printed circuit board may include a plurality of flexible printed circuit boards arranged in the first direction, and the blocking portion may be disposed between neighboring flexible printed circuit boards.

The blocking portion may include a bending pattern that is sharp toward one edge of the second substrate between the neighboring flexible printed circuit boards.

The blocking portion may include a curved line pattern that is convex toward one edge of the second substrate between the neighboring flexible printed circuit boards.

The protective layer may include silicon.

A display device according to another exemplary embodiment of the present inventive concept includes: a substrate including a display area; a pad area that is disposed between the display area and an edge of the substrate; a flexible printed circuit board bonded to the pad area; a blocking portion that is disposed between the pad area and an edge of the substrate; and a protective layer that is disposed between the display area and the blocking portion to cover the flexible printed circuit board and contacts the blocking portion.

The flexible printed circuit board may be provided in plural and the plurality of flexible printed circuit boards may be arranged along the edge of the substrate, and the blocking portion may be disposed between neighboring flexible printed circuit boards.

The pad area may include a plurality of first pads arranged along the edge of the substrate and a plurality of second pads arranged in parallel with the plurality of first pads, and the flexible printed circuit board may include a first flexible printed circuit board that is electrically connected with the plurality of first pads and a second flexible printed circuit board that overlaps the first flexible printed circuit board and is electrically connected with the plurality of second pads.

The protective layer may cover a pad gap between the plurality of first pads and the plurality of second pads.

The blocking portion may include at least one dam extending along an edge of the substrate and protruding from one side of the substrate.

The at least one dam may be formed of a plurality of layers, and the plurality of layers may include the same material as a material stacked in the display area.

The blocking portion may include a groove that extends along the edge of the substrate and formed in one side of the substrate.

The blocking portion may include a bending pattern that is sharp toward the display area.

The blocking portion may include a curved line pattern that is convex toward the display area.

The protective layer may include silicon.

A coating width of an insulation material that covers a portion where a flexible printed circuit board and a display panel are bonded to each other can be controlled to be constant, and occurrence of defects such as shorts or burns in a plurality of pads and wires of a flexible printed circuit board can be prevented by preventing water from entering between the flexible printed circuit board and the display panel.

DETAILED DESCRIPTION

Figure 1:
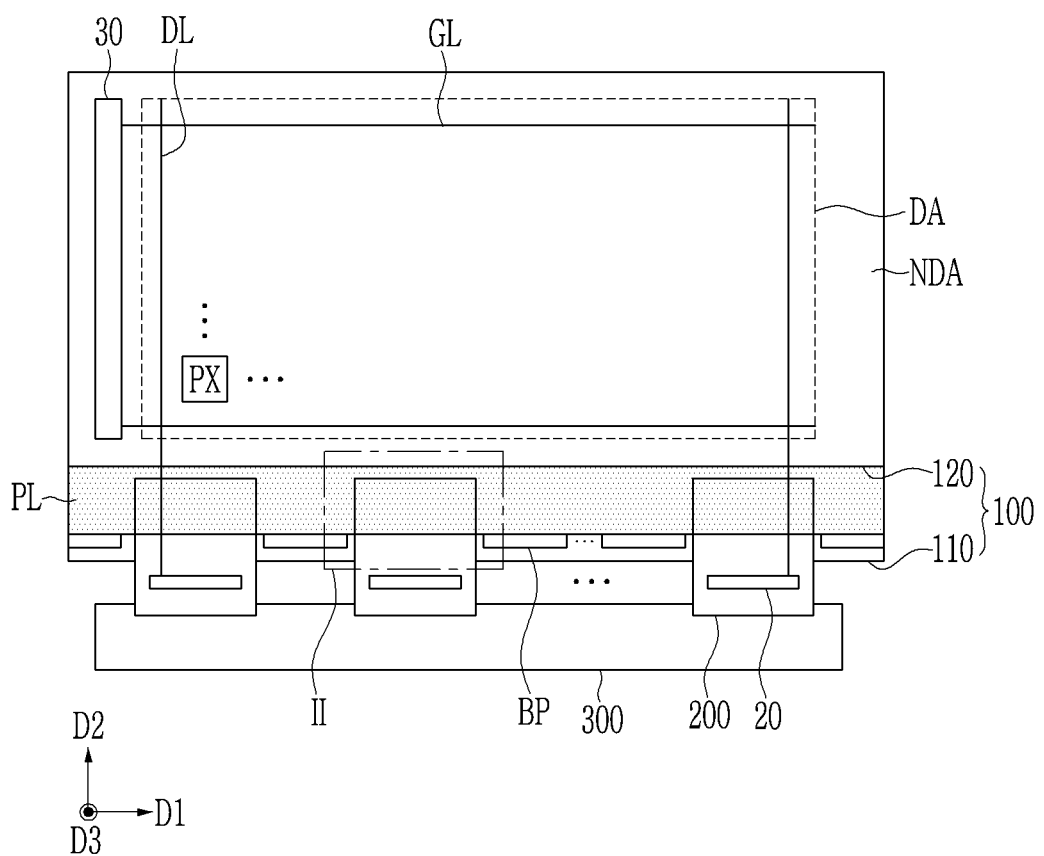
FIG. 1 is a schematic top plan view of a display device according to an exemplary embodiment of the present inventive concept.

Hereinafter, an exemplary embodiment of the present inventive concept will be described in detail with reference to the accompanying drawings so that those skilled in the technical field to which the present inventive concept pertains may carry out the exemplary embodiment. As those skilled in the art would realize, the described embodiment may be modified in various different ways, all without departing from the spirit or scope of the present inventive concept.

Further, in the exemplary embodiments, since like reference numerals designate like elements having the same configurations, a first exemplary embodiment is representatively described, and in other exemplary embodiments, only different configurations from the first exemplary embodiment will be described.

Accordingly, the drawings and description are to be regarded as illustrative in nature and not restrictive. Like reference numerals designate like elements throughout the specification.

Further, since a size and a thickness of each element illustrated in the drawings are arbitrarily illustrated for convenience of description, the present inventive concept is not necessarily limited to those shown in the drawings. In the drawings, the thicknesses of layers and regions are exaggerated for clarity. In addition, in the drawing, for convenience of description, the thicknesses of some of layers, films, panels, regions, etc., are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

First, referring to FIG. 1 to FIG. 5, a display device according to an exemplary embodiment of the present inventive concept will be described.

Figure 2:
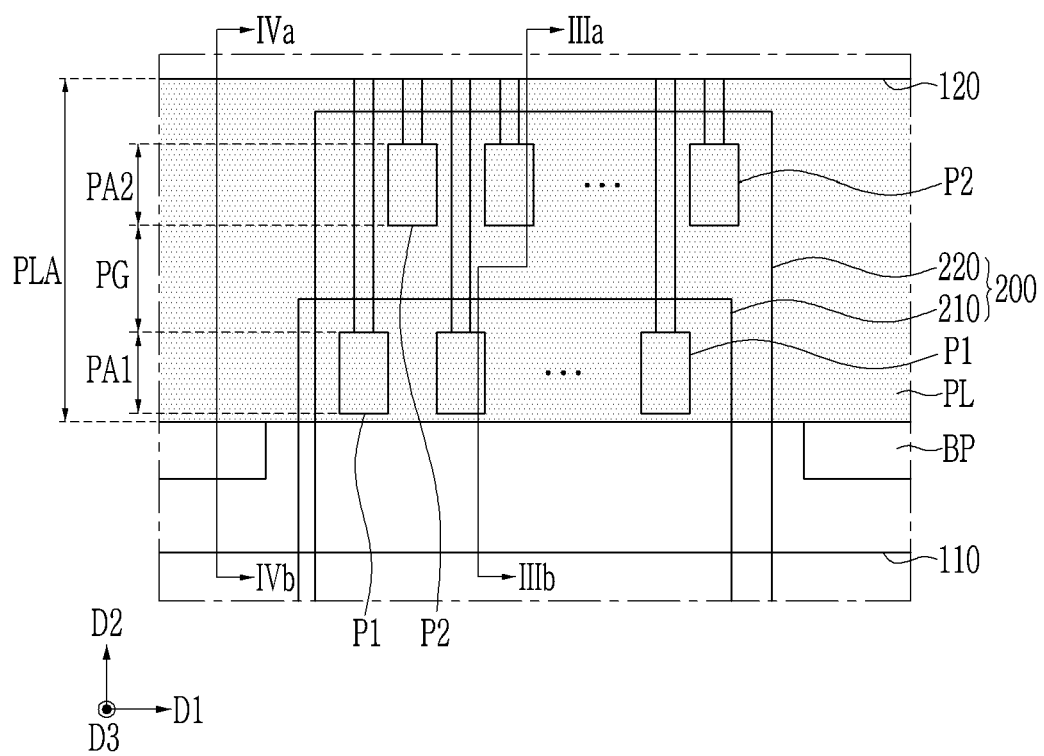
FIG. 2 is an enlarged view of the portion II in FIG. 1.
Figure 3:
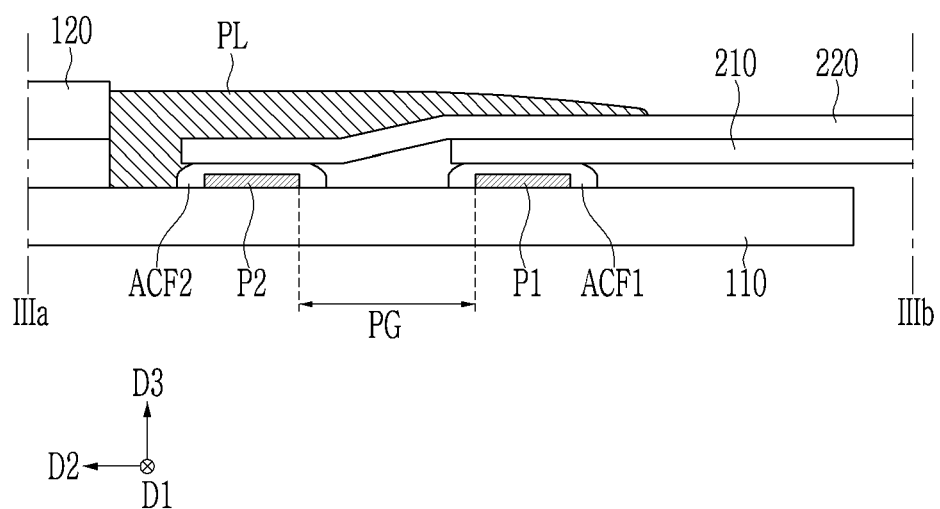
FIG. 3 is a cross-sectional view of FIG. 2, taken along the line IIIa-IIIb.
Figure 4:
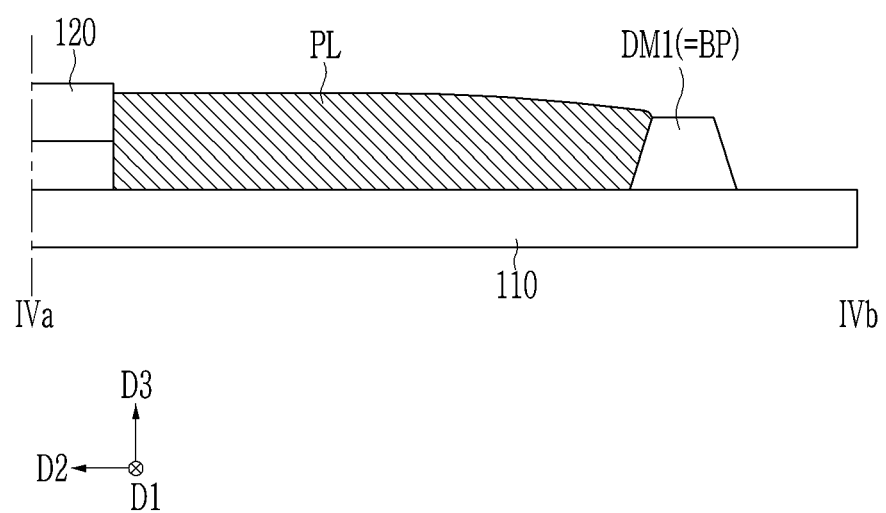
FIG. 4 is a cross-sectional view of FIG. 2, taken along the line IVa-IVb.
Figure 5:
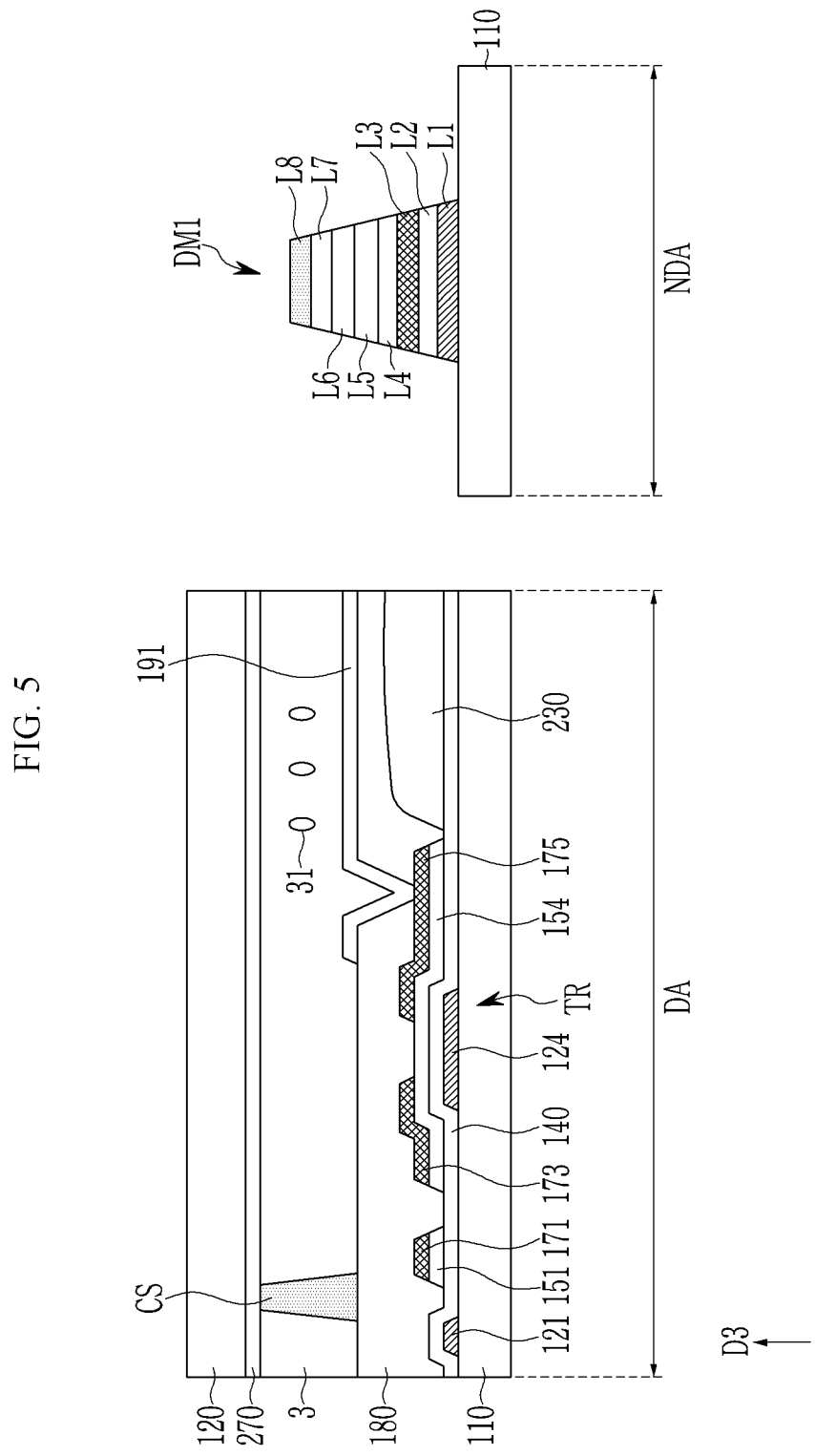
FIG. 5 is a cross-sectional view provided for description of a dam formed of a plurality of layers according to the exemplary embodiment of the present inventive concept.

FIG. 1 is a schematic top plan view of a display device according to an exemplary embodiment of the present inventive concept. FIG. 2 is an enlarged view of the portion II of FIG. 1. FIG. 3 is a cross-sectional view of FIG. 2, taken along the line IIIa-IIIb. FIG. 4 is a cross-sectional view of FIG. 2, taken along the line IVa-IVb. FIG. 5 is a cross-sectional view provided for description of a dam formed of a plurality of layers according to the exemplary embodiment of the present inventive concept.

Referring to FIG. 1 to FIG. 5, a display device includes a display panel 100, a flexible printed circuit board (FPCB) 200, a protective layer PL, a blocking portion BP, and a printed circuit board (PCB) 300.

The display panel 100 includes a first substrate 110 and a second substrate 120 that overlap each other. The display panel 100 includes a display area DA and a non-display area NDA. The non-display area NDA may be a peripheral area surrounding the display area DA.

The display area DA includes a plurality of pixels PX, and may be disposed in a portion where the first substrate 110 and the second substrate 120 are overlapped with each other. The display area DA may include a plurality of gate lines GL and a plurality of data lines DL connected to the plurality of pixels PX. The plurality of gate lines GL may extend in a first direction D1, and the plurality of data lines DL may extend in a second direction D2. The first direction D1 and the second direction D2 may be perpendicular to each other.

The first substrate 110 includes a plurality of pads P1 and P2 arranged in a portion that does not overlap the second substrate 120. A plurality of first pads P1 among the plurality of pads P1 and P2 may be arranged in the first direction D1 along an edge of the display panel 100. A plurality of second pads P2 among the plurality of pads P1 and P2 may be arranged in the first direction D1 to be parallel with the first pads P1. The plurality of first pads P1 are arranged in a first pad area PA1, and the plurality of second pads P2 are arranged in a second pad area PA2. The first pad area PA1 and the second pad area PA2 are disposed between the display area DA and an edge of the first substrate 110. The first pad area PA1 may be located closer to the edge of the first substrate 110 than the second pad area PA2. The first pad area PA1 and the second pad area PA2 may be spaced apart by a predetermined pad gap PG in a second direction D2. That is, the plurality of first pads P1 and the plurality of second pads P2 are disposed apart from each other in the second direction D2 by the pad gap PG.

The second substrate 120 may include one edge that exposes the plurality of first pads P1 and the plurality of second pads P2. That is, the second substrate 120 may not overlap the first substrate 110 where the plurality of first pads P1 and the plurality of second pads P2 are disposed, i.e., the second substrate 120 may not overlap the plurality of first pads P1 and second pads P2. Materials that form the plurality of pixels and the gate lines GL and data lines DL connected to the plurality of pixels PX may be stacked between the first substrate 110 and the second substrate 120.

The flexible printed circuit board 200 may be electrically connected to the display panel 100 through the pad areas PA1 and PA2. The flexible printed circuit board 200 may include a first flexible printed circuit board 210 electrically connected with the plurality of first pads P1, and a second flexible printed circuit board 220 electrically connected with the plurality of second pads P2. The first flexible printed circuit board 210 and the second flexible printed circuit board 220 may overlap each other. One end of the first flexible printed circuit board 210 may be electrically connected with the plurality of first pads P1 by a first anisotropic conductive film ACF1. The first anisotropic conductive film ACF1 may be disposed between the plurality of first pads P1 and the first flexible printed circuit board 210 in the first pad area PA1. The second flexible printed circuit board 220 further extends in the second direction D1 on the first flexible printed circuit board 210, and one end of the second flexible printed circuit board 220 may be electrically connected with the plurality of second pads P2 by a second anisotropic conductive film ACF2. The second anisotropic conductive film ACF2 may be disposed between the plurality of second pads P2 and the second flexible printed circuit board 220 in the second pad area PA2.

The protective layer PL may cover the first flexible printed circuit board 210 and the second flexible printed circuit board 220 by being formed with a width that includes the plurality of first pads P1 and the plurality of second pads P2 from one edge of the second substrate 120. The protective layer PL may cover the first flexible printed circuit board 210 and the second flexible printed circuit board 220 by extending in the first direction D1 along one edge of the second substrate 120. A protective layer area PLA where the protective layer PL is formed may include the first pad area PA1 and the second pad area PA2. The protective layer PL may be disposed between the display area DA and the blocking portion BP. In FIG. 1 and FIG. 2, the shaded portion indicates the protective layer PL on a plane.

The protective layer PL covers the pad gap PG between the first pad area PA1 and the second pad area PA2 in a portion that contacts an edge of the first flexible printed circuit board 210 and an edge of the second flexible printed circuit board 220. Accordingly, a portion that is covered by the first flexible printed circuit board 210 and the second flexible printed circuit board 220 in the pad gap PG between the first pad area PA1 and the second pad area PA2 is sealed by the protective layer PL, and thus permeation of a foreign substance such as moisture can be prevented. The protective layer PL may include an insulation material such as silicon.

The blocking portion BP is provided to limit a width of the protective layer PL, and prevents an insulation material applied between one edge of the second substrate 120 and the blocking portion BP from flowing over a predetermined width during a process for forming the protective layer PL. The insulation material is cured by ultraviolet (UV) rays such that the protective layer can be formed.

The blocking portion BP may be disposed on the first substrate 110 while being separated from one edge of the substrate 120 by a predetermined distance. The blocking portion BP may be distanced from one edge of the second substrate 120 such that the plurality of first pads P1 and the plurality of second pads P2 can be included therebetween. Alternatively, the blocking portion BP may be distanced from one edge of the second substrate 210 such that the pad gap PG between the first pad area PA1 and the second pad area PA2 can be included therebetween. The blocking portion BP may be disposed between the pad areas PA1 and PA2 and an edge of the first substrate 110.

As exemplarily shown in FIG. 1, the flexible printed circuit board 200 is provided in plural and arranged in the first direction D1, and the blocking portion BP may be disposed between neighboring flexible printed circuit boards 200. The blocking portion BP may extend in the first direction D1 between neighboring flexible printed circuit boards 200. A blocking portion BP disposed at opposite ends rather than being disposed between neighboring flexible printed circuit boards 200 may extend to an edge of the first substrate 110 in the first direction D1.

As exemplarily shown in FIG. 4, the blocking portion BP may include a first dam DM1 that protrudes in a third direction D3 from one side of the first substrate 110 and contacts a side surface of the protective layer PL. The first dam DM1 may be formed of a plurality of layers, and the plurality of layers may include the same material as the material stacked in the display area DA between the first substrate 110 and the second substrate 120. This will be described with reference to FIG. 5.

As exemplarily shown in FIG. 5, a plurality of layers are stacked between the first substrate 110 and the second substrate 120 in the display area DA such that signal lines and elements are formed. The first substrate 110 and the second substrate 120 may be optically transparent insulation substrates formed of glass and the like.

A gate conductor including a gate line 121 and a gate electrode 124 may be disposed on the first substrate 110. The gate conductor may be formed by stacking a conductive material such as molybdenum (Mo), copper (Cu), aluminum (Al), silver (Ag), chromium (Cr), tantalum (Ta), titanium (Ti), and the like on the first substrate 110, and then patterning the conductive material. The gate line 121 may be one of the plurality of gate lines GL shown in FIG. 1.

A gate insulation layer 140 may be disposed on the gate conductor. The gate insulation layer 140 may include an inorganic insulating material such as a silicon oxide (SiOx), a silicon nitride (SiNx), and the like.

A semiconductor 151 and a semiconductor layer 154 of a transistor TR may be disposed on the gate insulation layer 140. The semiconductor 151 and the semiconductor layer 154 may include amorphous silicon, polysilicon, or an oxide semiconductor.

A data line 171 may be disposed on the semiconductor 151, and a source electrode 173 and a drain electrode 175 of the transistor TR may be disposed on the semiconductor layer 154. The data line 171 may be one of the plurality of data lines DL shown in FIG. 1. The data conductor including the data line 171, the source electrode 173, and the drain electrode 175 may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy thereof.

A color filter 230 and a planarization layer 180 may be disposed on the data conductor. The color filter 230 may display one of primary colors. Examples of the primary colors include three primary colors such as red, green, and blue, or yellow, cyan, and magenta, and the like. The planarization layer 180 may include an organic insulation material.

A pixel electrode 191 may be disposed on the planarization layer 180. The pixel electrode 191 may receive a data voltage by being electrically connected with the drain electrode through a contact hole formed in the planarization layer 180. The pixel electrode 191 may include a transparent conductive material such as indium tin oxide (ITO), indium zinc oxide (IZO), and the like.

A liquid crystal layer 3 including liquid crystal molecules 31 may be disposed on the pixel electrode 191, and the second substrate 120 may be disposed on the liquid crystal layer 3. Depending on exemplary embodiments, the liquid crystal layers 3 may be formed to be distanced from each other within microcavities. A column spacer CS supporting the second substrate 120 may be disposed between the planarization layer 180 and the second substrate 120 so that the liquid crystal layer 3 may be uniformly formed. The column spacer CS may include an organic insulating material.

A common electrode 270 may be disposed between the liquid crystal layer 3 and the second substrate 120. The common electrode 270 may include a transparent conductive material such as ITO, IZO, and the like.

The orientation of the liquid crystal molecules 31 is controlled by pixel unit by an electric field generated by a voltage applied to the pixel electrode 191 and the common electrode 270 so that an image may be displayed by adjusting transmittance.

As exemplarily shown in FIG. 5, the first dam DM1 disposed in a non-display area NDA may be formed of eight layers. A first layer L1 may be formed through the same process as the gate electrode 124, and thus may be formed of the same material as the gate electrode 124. A second layer L2 is formed through the same process as the semiconductor layer 154, and thus may be formed of the same material as the semiconductor layer 154. A third layer L3 is formed through the same process as the data conductor and thus may be formed of the same material as the data conductor. A fourth layer L4, a fifth layer L5, and a sixth layer L6 may be formed through the same process as the color filter 230 of the three primary colors, and may be formed of the same material as the color filter 230. A seventh layer L7 is formed through the same process as the planarization layer 180, and thus may be formed of the same material as the planarization layer 180. An eighth layer L8 is formed through the same process as the column spacer CS and thus may be formed of the same material as the column spacer CS. In FIG. 5, the first dam DM1 is formed of eight layers, but depending on exemplary embodiments, the first dam DM1 may be formed by including at least one of the above-described eight layers. For example, the first dam DM1 may be formed by including an organic insulation material rather than including a conductive material.

Since the first dam DM1 is formed of the plurality of layers, the first dam DM1 may have a height that is high enough to prevent the insulation material forming the protective layer PL from overflowing. For example, the gate electrode 124 has a thickness of about 0.7 μm, the semiconductor layer 154 may have a thickness of about 0.6 μm, the data conductor may have a thickness of about 0.6 μm, the color filter 230 may have a thickness of about 2.4 μm, the planarization layer 180 may have a thickness of about 1.4 μm, the column spacer CS may have a thickness of about 2.2 μm, and a height of the first dam DM1 formed through the same process thereof may be 12 μm or more.

The structure of the display area DA illustrated in FIG. 5 is only one example embodiment, and as will be appreciated by those skilled in the art in light of the present disclosure, the display panel may be configured in various configurations in addition to the illustrated structure, and according to the configuration of the display panel, the order in which a plurality of layers constituting the dam DM1 are stacked and the number of the plurality of layers may be variously changed.

Referring back to FIG. 1, the flexible printed circuit board 200 may include a data driver 20. The data driver 20 is provided as an IC chip, and thus may be installed in the flexible printed circuit board 200. The data driver 20 is connected with the plurality of data lines DL through the flexible printed circuit board 200, and may apply a data voltage to the plurality of data lines DL.

In the non-display area NDA, a gate driver 30 that applies a gate signal to the plurality of gate lines GL is disposed. The gate driver 30 extends in the second direction D2 along one side of the display area DA, and thus may be connected to the plurality of gate lines GL.

The printed circuit board 300 is electrically connected with the other end of the flexible printed circuit board 200. The printed circuit board 300 may include a signal controller (not shown) that controls the data driver 20 and the gate driver 30. The signal controller may transmit a control signal for controlling the data driver 20 and the gate driver 30 through the flexible printed circuit board 200.

Hereinafter, a blocking portion BP according to another exemplary embodiment will be described with reference to FIG. 6 and FIG. 7. Only differences compared to the above-described exemplary embodiments of FIG. 1 to FIG. 5 will be mainly described.

Figure 6:
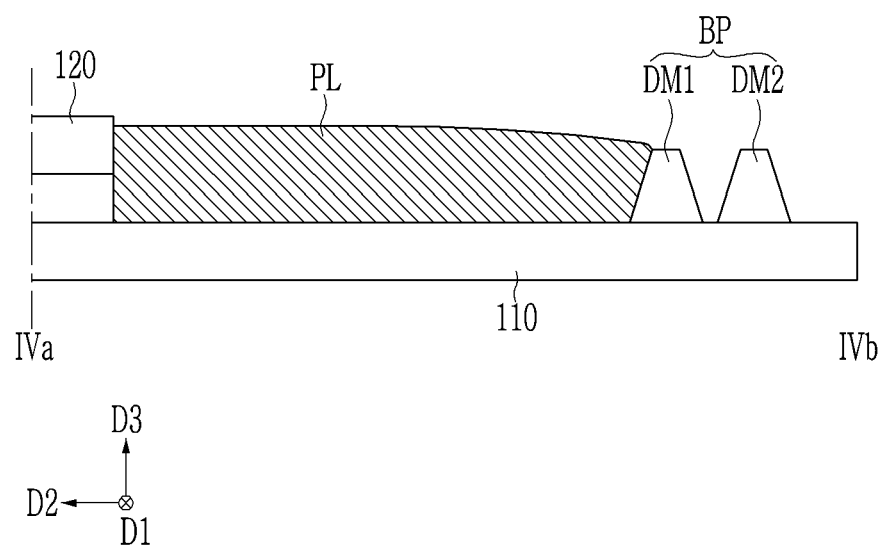
FIG. 6 is a cross-sectional view of a blocking portion according to another exemplary embodiment of the present inventive concept.

FIG. 6 is a cross-sectional view of a blocking portion according to another exemplary embodiment of the present inventive concept.

Referring to FIG. 6, a blocking portion BP may include a plurality of dams DM1 and DM2 separated in a second direction D2.

For example, the blocking portion BP may include a first dam DM1 and a second dam DM2 protruded from a first substrate 110. The second dam DM2 may extend in parallel with the first dam DM1. When the first dam DM1 extends in the first direction D1, the second dam DM2 may extend in the first direction D1 while having a constant gap in a second direction D2. The second dam DM2 may be formed of a plurality of layers as described above with reference to FIG. 5. The second dam DM2 is formed of a plurality of layers that are the same as those of the first dam DM1, so that the second dam DM2 may have the same height as the first dam DM1. Alternatively, unlike the first dam DM1, the second dam DM2 may be formed of one or more layers, and thus may have a different height than the first dam DM1.

In FIG. 6, the blocking portion BP includes two dams DM1 and DM2 that are separated from each other in the second direction D2, but the number of dams separated from each other in the second direction D2 is not restrictive.

Since the blocking portion BP includes the plurality of dams DM1 and DM2 separated in the second direction D2, the insulation material forming the protective layer PL, overflowing the first dam DM1, may be received in a groove between the plurality of dams DM1 and DM2. Accordingly, the width of the protective layer PL may be controlled to be constant.

Except for such a difference, the features of the exemplary embodiment described with reference to FIGS. 1 to 5 are applicable to the exemplary embodiment described with reference to FIG. 6, and therefore a duplicated description of the same features will be omitted.

Figure 7:
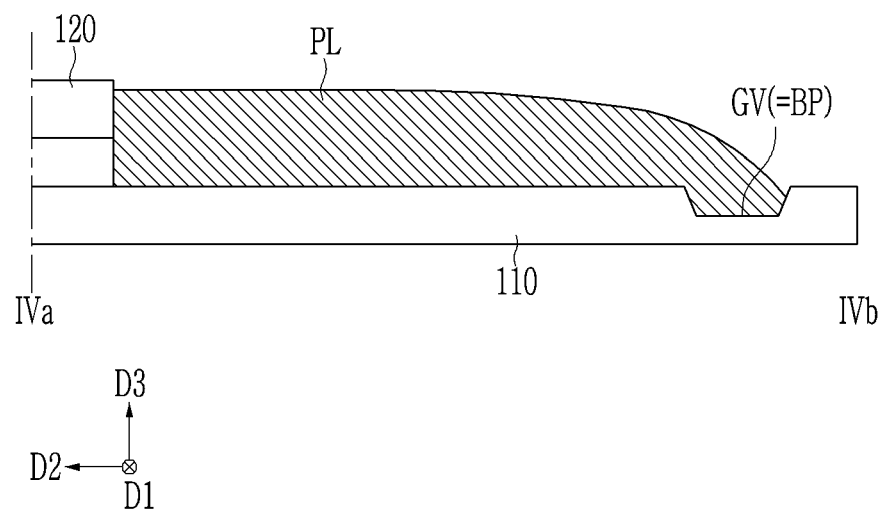
FIG. 7 is a cross-sectional view of a blocking portion according to another exemplary embodiment of the present inventive concept.

FIG. 7 is a cross-sectional view of a blocking portion according to another exemplary embodiment of the present inventive concept.

Referring to FIG. 7, a blocking portion BP includes a groove GV formed in a first substrate 110. The groove GV may extend in a first direction D1. The groove GV may be formed together in a process for grinding an edge of the first substrate 110. An insulation material forming a protective layer PL may be received in the groove GV, and a width of the protective layer PL may be controlled to form the protective layer PL only up to the groove GV.

The exemplary embodiment described with reference to FIG. 7 differs from the exemplary embodiment described with reference to FIG. 1 to FIG. 5 in that the groove GV is formed in the first substrate 110 instead of forming the first dam DM1. Excluding such a difference, features of the exemplary embodiment described with reference to FIGS. 1 to 5 are applicable to the exemplary embodiment described with reference to FIG. 7, and therefore a duplicated description of the same features will be omitted.

Hereinafter, an exemplary embodiment in which a blocking portion BP is disposed in a pattern other than a straight line in a plan view will be described with reference to FIGS. 8 and 9.

Figure 8:
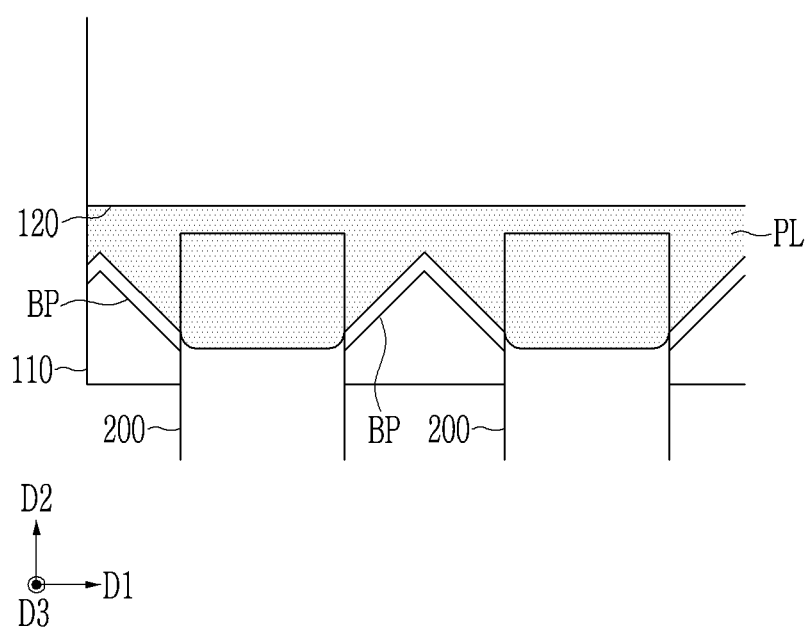
FIG. 8 is a top plan view of an arrangement of the blocking portion of another exemplary embodiment of the present inventive concept.

FIG. 8 is a top plan view of arrangement of a blocking portion according to another exemplary embodiment of the present inventive concept.

Referring to FIG. 8, a blocking portion BP may be disposed as a caret symbol (^) between adjacent flexible printed circuit boards 200. That is, the blocking portion BP may include a sharp bending pattern that extends toward one edge of a second substrate 120 or a display area DA between neighboring flexible printed circuit boards 200, e.g., the sharp point of the caret is pointing towards the one edge of the second substrate 120. Blocking portions BP disposed at opposite ends rather than being disposed between neighboring flexible printed circuit boards 200 may also extend to an edge of the first substrate 110 with a bending pattern.

The blocking portion BP having the bending pattern may include the first dam DM1 shown in FIG. 4, and the first dam DM1 may be disposed in a bending pattern on a plane. Alternatively, the blocking portion BP having the bending pattern may include the first dam DM1 and the second dam DM2 shown in FIG. 6, and the first dam DM1 and the second dam DM2 may be arranged in a bending pattern on a plane. Alternatively, the blocking portion BP having the bending pattern may include the groove GV shown in FIG. 7, and the groove may be arranged in a bending pattern on a plane.

The protective layer PL may be formed to be more concentrated near the edge of the flexible printed circuit board 200 according to the shape of the blocking portion BP. Accordingly, foreign particles such as moisture, which may flow between the first substrate 110 and the flexible printed circuit board 200 through the edge of the flexible printed circuit board 200, may be more effectively blocked. The shaded portion in FIG. 8 indicates the planar protective layer PL.

The exemplary embodiment described with reference to FIG. 8 differs from the exemplary embodiment described with reference to FIGS. 1 to 5 in that the blocking portion BP includes the bending pattern rather than a straight-line pattern. Excluding such a difference, the features of the exemplary embodiment described with reference to FIGS. 1 to 5 are applicable to the exemplary embodiment described with reference to FIG. 8, and therefore a duplicated description for the same features will be omitted.

Figure 9:
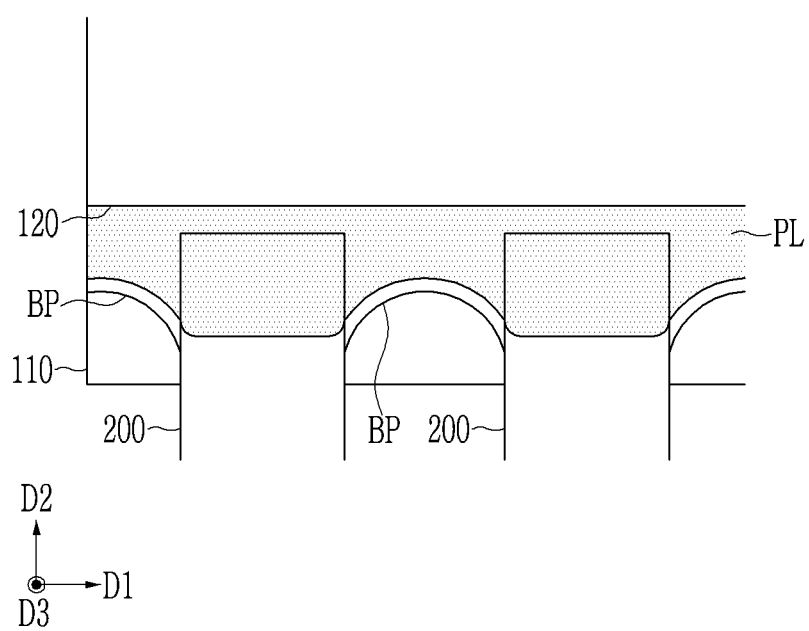
FIG. 9 is a top plan view of an arrangement of the blocking portion of another exemplary embodiment of the present inventive concept.

FIG. 9 is a top plan view of arrangement of a blocking portion according to another exemplary embodiment of the present inventive concept.

Referring to FIG. 9, the blocking unit BP may be disposed in a curved shape between adjacent flexible printed circuit boards 200. That is, the blocking portion BP may include a curved line pattern that is convex toward one edge of the second substrate 120 between neighboring flexible printed circuit boards 200 or a display area DA. Blocking portions BP disposed at opposite ends rather than being disposed between neighboring flexible printed circuit boards 200 may extend to an edge of a first substrate 110 with the curved line pattern.

The blocking portion BP having the curved line pattern may include the first dam DM1 shown in FIG. 4, and the first dam DM1 may be disposed in a curved line pattern on a plane. Alternatively, the blocking portion BP having the curved line pattern may include the first dam DM1 and the second dam DM2 shown in FIG. 6, and the first dam DM1 and the second dam DM2 may be arranged in a curved line pattern on a plane. Alternatively, the blocking portion BP having the curved line pattern may include the groove GV shown in FIG. 7, and the groove GV may be arranged in a curved line pattern on a plane.

A protective layer PL may be formed more intensively near the edge of the flexible printed circuit board 200 according to the shape of the blocking portion BP. Accordingly, foreign particles such as moisture, which may flow in between a first substrate 110 and the flexible printed circuit board 200 through the edge of the flexible printed circuit board 200, may be more effectively blocked. The shaded portion in FIG. 9 indicates the planar protective layer PL.

The exemplary embodiment described above with reference to FIG. 9 shows that the blocking portion BP includes a curved line pattern rather than a straight line, and this is different from the exemplary embodiment described with reference to FIG. 1 to FIG. 5. Except for such a difference, the features of the exemplary embodiment described with reference to FIG. 1 to FIG. 5 are applicable to the exemplary embodiment described with reference to FIG. 9, and therefore a duplicated description for the same features will be omitted.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims. It will be understood by those skilled in the art that various changes in form and detail may be made without departing from the scope of the present inventive concept. Accordingly, the true scope of the present inventive concept should be determined by the technical idea of the appended claims.

What is claimed is:

1. A display device comprising:
   a first substrate that includes a plurality of first pads arranged in a first direction and a plurality of second pads arranged in parallel with the plurality of first pads;
   a second substrate that overlaps the first substrate and includes one edge exposing the plurality of first pads and the plurality of second pads;
   a first flexible printed circuit board that is electrically connected with the plurality of first pads;
   a second flexible printed circuit board that overlaps the first flexible printed circuit board and is electrically connected with the plurality of second pads;
   a protective layer that covers the first flexible printed circuit board and the second flexible printed circuit board from the one edge of the second substrate to a width including the plurality of first pads and the plurality of second pads; and
   a blocking portion disposed on the first substrate at a distance from the one edge of the second substrate by a width of the protective layer and contacting the protective layer.

2. The display device of claim 1, wherein the blocking portion comprises a first dam that extends in the first direction, protrudes from one side of the first substrate, and contacts a side surface of the protective layer.

3. The display device of claim 2, wherein the first dam is formed of a plurality of layers, and
   the plurality of layers comprise a same material as a material stacked between the first substrate and the second substrate.

4. The display device of claim 3, wherein a display area between the first substrate and the second substrate comprises:
   a transistor including a gate electrode, a semiconductor layer, and a data conductor; and
   a color filter, an insulation layer, and a column spacer that are sequentially disposed on the transistor, and
   the first dam comprises a same material as at least one of the gate electrode, the semiconductor layer, the data conductor, the color filter, the insulation layer, and the column spacer.

5. The display device of claim 2, wherein the blocking portion further comprises a second dam that extends in parallel with the first dam and protrudes from one side of the first substrate.

6. The display device of claim 1, wherein the blocking portion comprises a groove that extends in the first direction and is formed in one side of the first substrate.

7. The display device of claim 1, wherein each of the first flexible printed circuit board and the second flexible printed circuit board comprises a plurality of flexible printed circuit boards arranged in the first direction, and
   the blocking portion is disposed between neighboring flexible printed circuit boards.

8. The display device of claim 7, wherein the blocking portion comprises a bending pattern that is sharp toward one edge of the second substrate between the neighboring flexible printed circuit boards.

9. The display device of claim 7, wherein the blocking portion comprises a curved line pattern that is convex toward one edge of the second substrate between the neighboring flexible printed circuit boards.

10. The display device of claim 1, wherein the protective layer comprises silicon.

11. A display device comprising:
    a substrate including a display area;
    a pad area that is disposed between the display area and an edge of the substrate;
    a flexible printed circuit board bonded to the pad area;
    a blocking portion that is disposed between the pad area and an edge of the substrate; and
    a protective layer that is disposed between the display area and the blocking portion to cover the flexible printed circuit board and contacts the blocking portion.

12. The display device of claim 11, wherein the flexible printed circuit board is provided in plural and the plurality of flexible printed circuit boards are arranged along the edge of the substrate, and
    the blocking portion is disposed between neighboring flexible printed circuit boards.

13. The display device of claim 11, wherein the pad area comprises a plurality of first pads arranged along the edge of the substrate and a plurality of second pads arranged in parallel with the plurality of first pads, and
    the flexible printed circuit board comprises a first flexible printed circuit board that is electrically connected with the plurality of first pads and a second flexible printed circuit board that overlaps the first flexible printed circuit board and is electrically connected with the plurality of second pads.

14. The display device of claim 13, wherein the protective layer covers a pad gap between the plurality of first pads and the plurality of second pads.

15. The display device of claim 11, wherein the blocking portion comprises at least one dam extending along the edge of the substrate and protruding from one side of the substrate.

16. The display device of claim 15, wherein the at least one dam is formed of a plurality of layers, and
    the plurality of layers comprise the same material as a material stacked in the display area.

17. The display device of claim 11, wherein the blocking portion comprises a groove that extends along the edge of the substrate and formed in one side of the substrate.

18. The display device of claim 11, wherein the blocking portion comprises a bending pattern that is sharp toward the display area.

19. The display device of claim 11, wherein the blocking portion comprises a curved line pattern that is convex toward the display area.

20. The display device of claim 11, wherein the protective layer comprises silicon.

* * * * *